United States Patent [19]
Avery

[11] Patent Number: 5,519,242
[45] Date of Patent: May 21, 1996

[54] ELECTROSTATIC DISCHARGE PROTECTION CIRCUIT FOR A NMOS OR LATERAL NPN TRANSISTOR

[75] Inventor: Leslie R. Avery, Flemington, N.J.

[73] Assignee: David Sarnoff Research Center, Inc., Princeton, N.J.

[21] Appl. No.: 291,808

[22] Filed: Aug. 17, 1994

[51] Int. Cl.$^6$ .................................... H01L 23/62
[52] U.S. Cl. .................. 257/356; 257/357; 257/362; 257/363
[58] Field of Search .................... 257/355, 356, 257/357, 358, 359, 360, 361, 362, 363

[56] References Cited

U.S. PATENT DOCUMENTS

| | | | |
|---|---|---|---|
| 4,405,933 | 9/1983 | Avery | 357/13 |
| 4,484,244 | 11/1984 | Avery | 361/56 |
| 4,492,974 | 1/1985 | Yoshida | 357/23 |
| 4,599,631 | 7/1986 | Tsuzuki | 357/13 |
| 4,916,085 | 4/1990 | Frisina | 437/44 |
| 5,010,380 | 4/1991 | Avery | 357/23.13 |
| 5,072,273 | 12/1991 | Avery | 357/38 |
| 5,162,966 | 11/1992 | Fujihira | 257/140 |
| 5,274,262 | 12/1993 | Avery | 257/362 |
| 5,285,069 | 2/1994 | Kaibara et al. | 257/392 |
| 5,304,802 | 4/1994 | Kumagai | 257/328 |
| 5,324,971 | 6/1994 | Notley | 257/328 |
| 5,343,053 | 8/1994 | Avery | 257/173 |
| 5,357,126 | 10/1994 | Jimenez | 257/173 |

FOREIGN PATENT DOCUMENTS

| | | | |
|---|---|---|---|
| 1-166562 | 6/1989 | Japan | 257/356 |
| 4-199569 | 7/1992 | Japan | 257/363 |

OTHER PUBLICATIONS

"Semiconductor chip Pad Protect Device", Kalter, IBM Technical Disclosure Bulletin, vol. 15 No. 12, May 1973, pp. 3753 and 3754.

*Primary Examiner*—Ngân V. Ngô
*Attorney, Agent, or Firm*—William J. Burke

[57] ABSTRACT

An electrical circuit including an NMOS or lateral NPN bipolar transistor includes a zener diode connected thereto to provide ESD protection for the transistor. The NMOS transistor includes an N-type source, an N-type drain, a P-type channel region and a gate over and insulated from the channel region. The zener diode is electrically connected between the gate and the drain of the NMOS transistor with the anode of the zener diode being connected to the gate and the cathode of the zener diode being connected to the drain. For some purposes the anode of the zener diode is positioned close to the gate to provide the desired ESD protection. The lateral NPN bipolar transistor includes an N-type emitter and collector and a P-type base. The zener diode is connected between the collector and the base with the anode of the zener diode being connected to the base and the cathode of the zener diode being connected to the emitter.

6 Claims, 2 Drawing Sheets

ELECTROSTATIC DISCHARGE PROTECTION CIRCUIT FOR A NMOS OR LATERAL NPN TRANSISTOR

The invention relates to an electrostatic discharge (ESD) protection circuit, and, more particularly, to a circuit for protecting an NMOS transistor or a lateral NPN bipolar transistor from electrostatic discharge (ESD).

BACKGROUND OF THE INVENTION

An NMOS transistor is a field effect transistor having N-type conductivity source and drain regions at opposite sides of a channel region of P-type conductivity. A conductive gate is over the channel region and is insulated therefrom by a layer of an insulating material, such as silicon dioxide. Electrostatic discharge (ESD) damage to NMOS output devices is a common occurrence in the use of integrated circuits (ICs) which include NMOS transistors. In larger geometry devices (NMOS transistors having gate lengths of at least 1.5 micrometers) with thick gate oxides (at least 2500 nanometers in thickness), the damage is usually due to source-drain snap-back and secondary breakdown across the channel region, resulting in a short between the source and drain. It is possible to design an NMOS output transistor to withstand a reasonable level of ESD by making use of the bipolar snap-back mechanism of the transistor. However, failure eventually occurs because of the secondary breakdown. As IC geometries, and gate oxide thickness shrink, the drain to gate becomes more vulnerable and can be the major weak point with regard to ESD damage. In NMOS transistors having a gate oxide thicknesses below 1000 nanometers, the drain to gate oxide breakdown is the major failure mechanism. This results from the necessity of designing the NMOS transistor to minimize hot carrier effects and often results in NMOS source-drain breakdown and snap-back voltage that are above the gate oxide breakdown voltage.

A lateral NPN bipolar transistor is similar in structure to an NMOS transistor in that it comprises a pair of N-type regions spaced apart by a P-type region. Such NPN bipolar transistors have similar problems with regard to ESD as the NMOS transistor, particularly when the width of the P-type region is very small.

SUMMARY OF THE INVENTION

The invention is directed to an electrical circuit which includes an NMOS transistor having a source, a drain and a gate. A zener diode is electrically connected between the gate and the drain of the NMOS transistor to provide ESD protection for the NMOS transistor.

The invention is also directed to an IC which includes a substrate of a semiconductor material having a surface and at least a portion of P-type conductivity. A pair of spaced first regions of N-type conductivity are in the P-type portion of the substrate at the surface. The first regions form the source and drain of an NMOS transistor with the portion of the substrate therebetween forming the channel of the NMOS transistor. A gate of a conductive material is over and insulated from the surface of the substrate along the channel of the NMOS transistor. A second region of N-type conductivity is in the substrate at the surface. A region of P+ type conductivity is in the substrate at the surface and forms a PN junction of a zener diode with the second region. Means electrically connects the second region to the drain of the NMOS transistor, and means electrically connects the P+ type region to the gate of the NMOS transistor.

DETAILED DESCRIPTION

Figure 1:
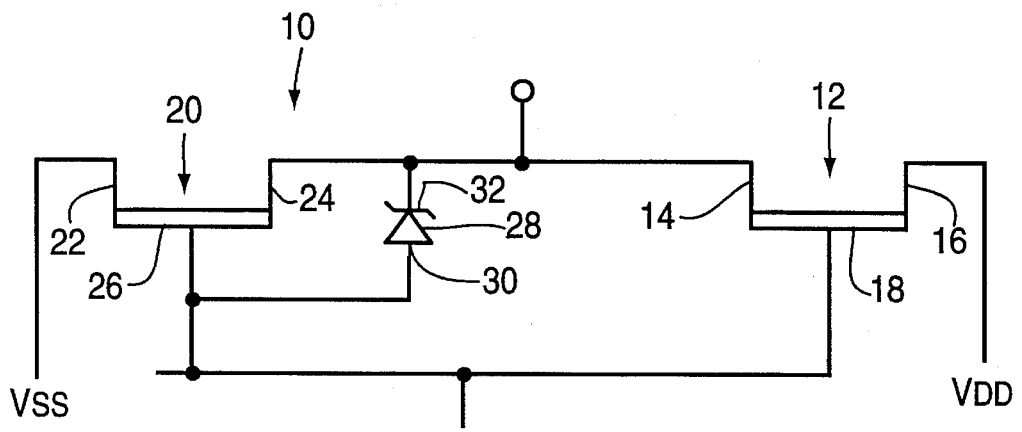
FIG. 1 is a circuit diagram of a CMOS circuit having a NMOS transistor with the ESD protection of the invention.

In FIG. 1, a CMOS circuit 10 having the ESD protection of the invention comprises a PMOS transistor 12 having a drain 14, source 16 and gate 18, and an NMOS transistor 20 having a source 22, drain 24 and gate 26. The drain 14 of the PMOS transistor 12 is connected to the drain 24 of the NMOS transistor 20, and the gates 18 and 26 of the PMOS and NMOS transistor 12 and 20 are connected together. The source 16 of the PMOS transistor 12 is connected to VDD, and the source 22 of the NMOS transistor 20 is connected to VSS. To protect the NMOS transistor 20 from ESD, a zener diode 28 is connected between the drain 24 and the gate 26 of the NMOS transistor 20. The anode 30 of the zener diode 28 is connected to the gate 26 of the NMOS transistor 20, and the cathode 32 of the zener diode 28 is connected to the drain 24 of the NMOS transistor 20.

The zener diode 28 serves to solve the drain-gate breakdown of the NMOS transistor 20 upon receiving an ESD. The zener diode 28 pulls the gate 26 of the NMOS transistor 20 high whenever the drain-gate voltage exceeds the zener breakdown voltage as a result of an ESD. By pulling the gate 26 of the NMOS transistor 20 high, drain-gate breakdown is prevented. The size of the zener diode 28 depends upon the drive to the gate 26 of the NMOS transistor 20. That is, the zener diode 28 must be of a size so that the current through the zener diode 28 overcomes the pull-down current of any NMOS predriver. When the NMOS transistor and its zener diode are built in an IC, the zener diode must be fabricated in a well of N-type conductivity to provide electrical isolation from the P-type conductivity substrate in which the NMOS transistor is formed.

Figure 2:
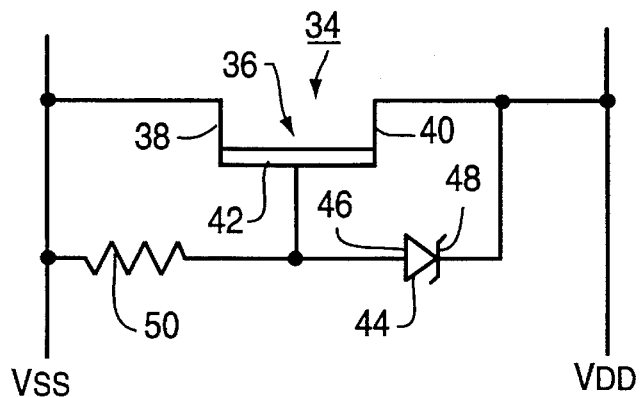
FIG. 2 is a Circuit diagram of a NMOS transistor having another form of the ESD protection of the invention.

In FIG. 2, a circuit diagram of an IC 34 having a NMOS transistor 36 to provide ESD protection for the power supply pins is shown. The NMOS transistor 36 includes a source 38, a drain 40 and a gate 42. The source 38 is electrically connected to VSS and the drain 40 is electrically connected to VDD. A zener diode 44 is connected between the drain 40 and the gate 42 of the NMOS transistor 36. The gate 42 is connected to the anode 46 of the zener diode 44, and the drain 40 is electrically connected to the cathode 48 of the zener diode 44. A resistor 50 is provided between the gate 42 of the NMOS transistor 36 and VSS. In the IC 34, the resistor 50 can be provided by the resistance of the semiconductor substrate in which the IC 34 is formed.

NMOS transistors have been used for ESD protection to the power supply pins of an IC. In such a circuit, the gate of the NMOS transistor is electrically connected to the source to provide the ESD protection. In such a circuit it is the parasitic NPN bipolar transistor formed by the NMOS transistor rather than the NMOS transistor itself that provides the protection. The gate of the NMOS transistor is used only to define the spacing between the drain (which is the collector of the bipolar transistor) and the source (which forms the emitter of the bipolar transistor). One of the biggest problems in using a large NMOS transistor for power supply protection is to ensure an even turn-on of the NPN bipolar transistor to avoid current concentration in a small area of the device and early failure. The zener diode 44 provides for a more even triggering of the NPN bipolar transistor into snap-back, taking full advantage of the full energy handling capability of the device. However, as the thickness of the gate insulation (generally a silicon oxide layer) decreases with decreased size of the elements of the IC, breakdown across the oxide layer between the gate and the drain of the NMOS transistor is possible before the device snaps-back into the low voltage conduction state. To overcome this problem in the IC 34 of the invention, the anode 46 of the zener diode 44 is placed close to the gate 42 of the NMOS transistor 36, and the gate 42 of the NMOS transistor 36 is connected to the anode 46 of the zener diode 44 rather than directly to the source 38 of the NMOS transistor 36. This structure ensures that a transient pulse, such as an electrostatic discharge, on the drain pulls both the gate and the substrate of the device under the gate high, minimizing the potential difference between the drain and the gate and substrate. This extends the usefulness of the ESD protection of the invention to ICs having small dimensions, such as below 0.5 micrometers.

Figure 3:
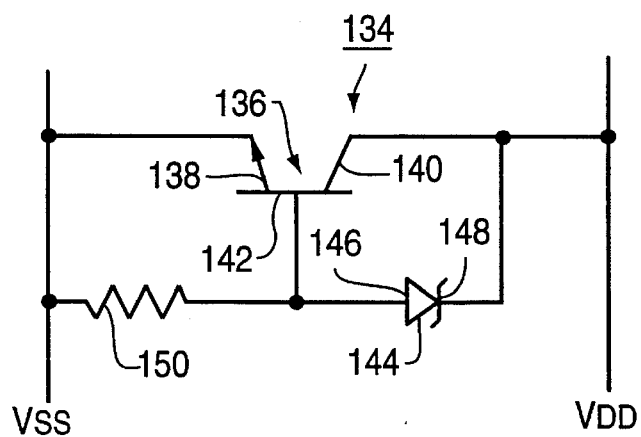
FIG. 3 is a circuit diagram of an NPN bipolar transistor having the ESD protection of the invention.

In FIG. 3, there is shown a protection circuit 134 of the invention for a lateral NPN bipolar transistor 136. The NPN bipolar transistor 136 comprises an N-type-type conductivity emitter 138, an N-type conductivity collector 140 and a P-type conductivity base 142. The emitter 138 of the NPN bipolar transistor 136 is connected to a negative power supply line Vss, and the collector 140 is connected to a positive power supply line Vdd. A zener diode 144 is connected between the collector 140 and the base 142 of the NPN bipolar transistor 136. The anode 146 of the zener diode 144 is connected to the base 142 of the NPN bipolar transistor 136 and the cathode 148 of the zener diode 144 is connected to the collector 140 of the NPN bipolar transistor 136. A resistor 150 is connected between the base 142 of the NPN bipolar transistor 136 and the negative power supply line Vss.

It should be noted that the structure of a lateral NPN bipolar transistor is very similar to that of a NMOS transistor. Both of these types of transistors comprise a pair of spaced N-type regions having a P-type region therebetween. In the NPN bipolar transistor, the N-type regions are the emitter and collector whereas in the NMOS transistor, the N-type regions are the source and drain. In the NPN bipolar transistor, the P-type region is the base, whereas in the NMOS transistor, the P-type region is the channel region. The NMOS transistor differs from the NPN bipolar transistor in that it includes a gate over and insulated from the P-type region. In both of the protection circuits 34 and 134 the anode 46 (146) of the zener diode 44 (144) is electrically connected to the P-type region of the transistor. In the NMOS transistor 36, the anode 46 of the zener diode 44 is electrically connected to the P-type channel region through the gate 42 which is insulated from the channel region. In the NPN bipolar transistor 136, the anode 146 of the zener diode 144 is electrically connected directly to the P-type base region 142 of the transistor 136.

However, the two types of transistors are affected similarly by a transient electrostatic discharge. In the protection circuits 34 (134) of the invention, the zener diode 44 (144) not only reduces the voltage difference between the drain 40 (collector 140) and gate 42 (base 142), but also triggers the base 142 of the lateral NPN bipolar transistor 136. When the zener voltage is exceeded, the protection circuit 134 shown in FIG. 3, forms a shunt regulator, holding the collector 142 to emitter voltage at the zener voltage plus 1 Vbe. Eventually, the current through the NPN bipolar transistor 136 is sufficient to cause the NPN bipolar transistor 136 to enter the plasma Vceo low resistance region necessary to provide transient protection.

In forming a lateral NPN bipolar transistor in an IC, it often has the same appearance as an NMOS transistor. To provide the NPN bipolar transistor with a very narrow P-type base region, a metal or polysilicon masking layer is often provided over and insulated from the surface of a P-type substrate and is used to define the spacing between the N-type regions which are formed by diffusion or ion implantation. A narrow mask of a metal or polysilicon more accurately defines the spacing between the two N regions than a narrow LOCOS region. However, in a lateral NPN bipolar transistor, the metal connection from the zener diode extends through the masking layer and the insulating layer thereunder directly to the P-type base region.

Figure 4:
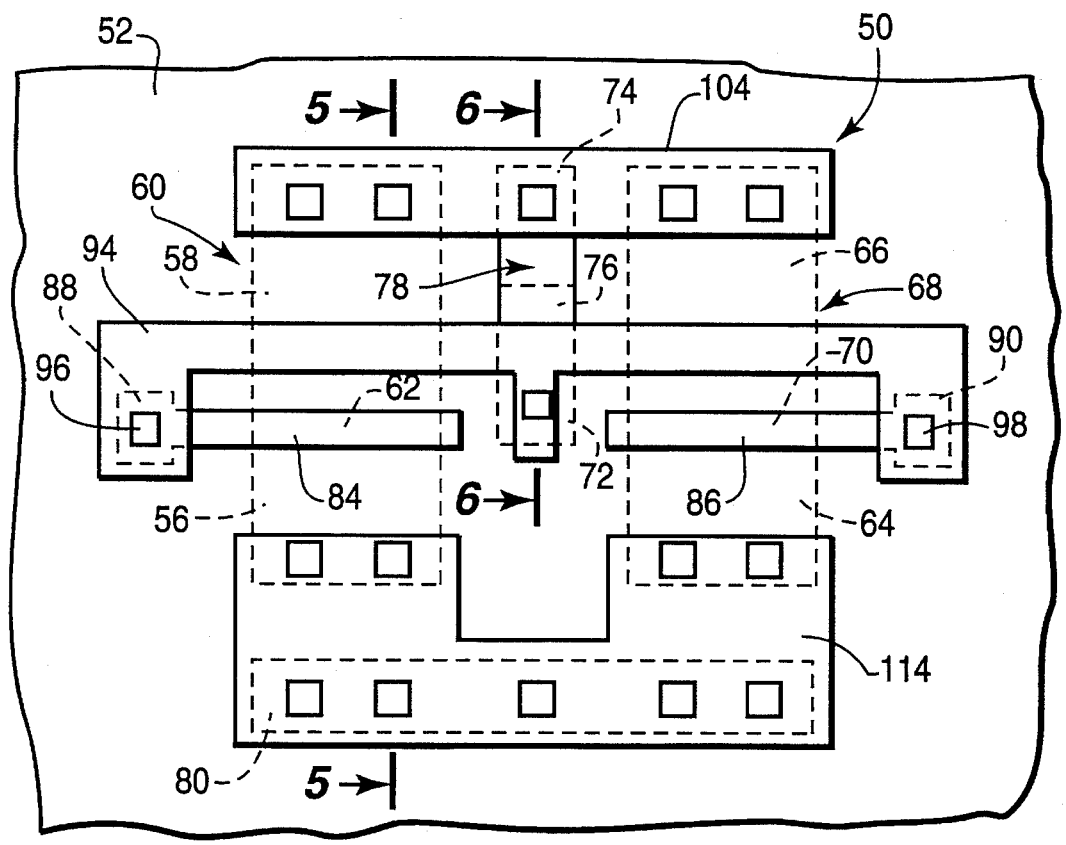
FIG. 4 is a top plan view of a CMOS IC device which includes the form of the ESD protection shown in the circuit of FIG. 2.
Figure 5:
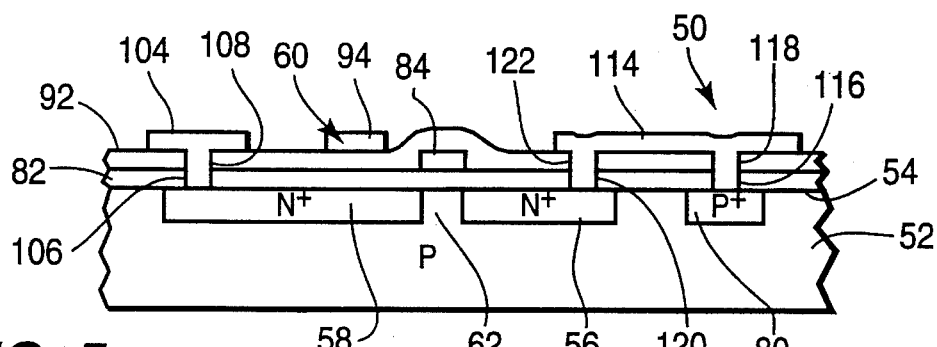
FIG. 5 is a sectional view taken along line 5—5 of FIG. 4.
Figure 6:
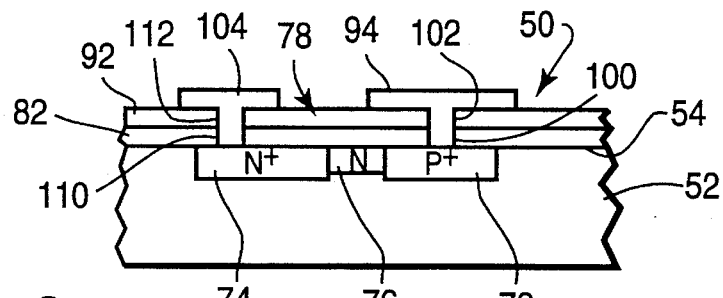
FIG. 6 is a sectional view taken along line 6—6 of FIG. 4.

Referring now to FIGS. 4, 5 and 6, there is shown a semiconductor IC device 50 which includes the protection circuit 34 shown in FIG. 2. Semiconductor device 50 includes a substrate 52 of a semiconductor material, such as single crystalline silicon, of P-type conductivity having a surface 54. A first pair of spaced regions 56 and 58 of N+ type conductivity are in the substrate 52 at the surface 54. The N+ type first regions 56 and 58 form the source and drain of a first NMOS transistor 60. The portion 62 of the substrate 52 between the first regions 56 and 58 forms the channel of the first NMOS transistor 60. A second pair of N+ type conductivity regions 64 and 66 are in the substrate 52 at the surface 54 adjacent but spaced from the first pair of regions 56 and 58. The second regions 64 and 66 form the source and drain of a second NMOS transistor 68. The second regions 64 and 66 are positioned so that the portion 70 of the substrate 52 between the second regions 64 and 66 is in alignment with the portion 62 of the substrate 52 between the first pair of regions 56 and 58. The portion 70 of the substrate 52 between the second regions 64 and. 66 forms the channel of the second NMOS transistor 68.

A third region 72 of P+ type conductivity is in the substrate 52 at the surface 54. The third region 72 is positioned in approximate alignment with the channel regions 62 and 70 of the NMOS transistors 60 and 68. A region 74 of N+ type conductivity is in the substrate 52 at the surface 54. The N+ region 74 is adjacent to the drain regions 58 and 68 and adjacent but spaced from the third region 72. An N-type region 76 is in the substrate 52 at the surface 54 between and contacting the P+ third region 72 and the N+ region 74. The N-type region 76 forms with the P+ region 72 a zener diode 78 with the N-type region 76 being the cathode of the zener diode 78 and the P+ region 72 being the anode of the zener diode 78. The N+ region 74 forms a highly conductive contact region for the N-type cathode region 76. A ground region 80 of P+ type conductivity is in the substrate 52 at the surface 54. The ground region 80 is spaced from the ends of the source regions 56 and 64 of the NMOS transistors 60 and 68.

A first layer 82 of an insulating material, such as silicon oxide, is over the surface 54 of the substrate 52 and covers the regions within the substrate 52. Separate strips 84 and 86 of a conductive material, such as doped polycrystalline silicon, are on the first insulating material layer 82 and extend over the channel regions 62 and 70 respectively. The strips 84 and 86 form the gates of the NMOS transistors 60 and 68. The strips 84 and 86 have enlarged terminal pad areas 88 and 90 respectively at their ends away from the third region 72.

A second layer 92 of an insulating material, such as silicon oxide, is over the first insulating material layer 82 and over the gate strips 84 and 86. A first connection strip 94 of a conductive material, such as a metal, is on the second layer 92 and extends between the terminal pad areas 88 and 90 of the gate strips 84 and 86. The first connection strip 94 also extends over the third region 72. The first connection strip 94 extends through openings 96 and 98 in the second insulating layer 92 and electrically contacts the terminal pad areas 88 and 90. The first connection strip 94 also extends through openings 100 and 102 in the first and second insulating layers 82 and 92 respectively and electrically contacts the third region 72. Thus, the gates 84 and 86 of the first and second NMOS transistors 60 and 68 are electrically connected to the third region 72 (the anode of the zener diode 78) by the first connection strip 94.

A second connection strip 104 of a conductive material, such as a metal, is on the second insulating material layer 92. The second connection strip 104 extends across the ends of the drain regions 58 and 66 of the NMOS transistors 60 and 68, and across the N+ type region 74. The second connection strip 104 extends through openings 106 and 108 in the first and second insulating material layers 82 and 92 and contacts the drain regions 58 and 66. The second connection strip 104 also extends through openings 110 and 112 in the first and second insulating material layers 82 and 92 and contacts the N+ type contact region 74. Thus, the drains 58 and 66 of the NMOS transistors 60 and 68 are electrically connected to the N region 76 (the cathode of the zener diode 78) by the second connection strip 104 and the N+contact region 74.

A third connection strip 114 is on the second insulating material layer 2 and extends over and across the ground region 80. The third connection strip 114 also extends over the ends of the source regions 56 and 64 of the NMOS transistors 60 and 68. The third connection strip 114 extends through holes 116 and 118 in the first and second insulating material layers 82 and 92 and contacts the ground region 80. The third connection strip also extends through holes 120 and 122 in the first and second insulating material layers and 92 and contacts the source regions 56 and 64. Thus, the source regions 56 and 64 of the NMOS transistors 60 and 68 are electrically connected to the ground region 80 through the third connection strip 114.

Thus, the semiconductor device 50 provides a lateral NPN transistor formed by the two NMOS transistors 60 and 68. The zener diode 78 is connected between the drains 58 and 66 of the NMOS transistors 60 and 68 and the gates 84 and 86 of the NMOS transistors 60 and 68 respectively. As shown by the circuit diagram of FIG. 2, the gates 84 and 86 are electrically connected to the anode 72 of the zener diode 78, and the drains 58 and 66 are electrically connected to the cathode 74 of the zener diode 78. Also, as can be seen in FIG. 4, the anode 72 of the zener diode 78 is located close to the gates 84 and 86 of the NMOS transistors 60 and 68 to provide the desired protection from ESD. The zener diode 78 triggers the lateral NPN transistor to provide the protection to the circuit.

Although the semiconductor device 50 is shown as being formed of two NMOS transistors 60 and 68 with the zener diode 78 therebetween, the semiconductor device 50 can be formed of a single NMOS transistor having a zener diode adjacent thereto. Also, the two gate strips 84 and 86 can be a single strip of a conductive material. In addition, the electrical connections between the drain regions 58 and 66 of the NMOS transistors 60 and 68 and the N+ contact region 74 of the zener diode 78 can be a highly conductive region within the substrate 52 rather than the conductive connection strip 104. Likewise, the connection between the source regions 56 and 64 of the NMOS transistors 60 and 68 can be a highly conductive region within the substrate 52.

Thus, there is provided by the invention an electrical circuit which includes a narrow base lateral NPN transistor with a zener diode electrically connected between the channel (base) and the drain (collector) of the NMOS (NPN) transistor to provide ESD protection for the circuit. There is also provided an electrical circuit and IC forming the electrical circuit in which the anode of the zener diode is located close to the gate of the NMOS transistor to provide the desired ESD protection.

What is claimed is:

1. An integrated circuit comprising:

a substrate of a semiconductor material having a surface and at least a portion of P-type conductivity;

a pair of spaced first regions of N-type conductivity in the P-type portion of the substrate at said surface, said first regions forming the source and drain of an NMOS transistor with the portion of the substrate between the first regions forming the channel of the NMOS transistor;

a gate of a conductive material over and insulated from the surface of the substrate along the channel of the NMOS transistor;

a second region of N-type conductivity in the P-type portion of the substrate at the surface;

a region of P+ type conductivity in the P-type portion of the substrate at said surface and forming a PN junction with the said N-type second region so as to form a zener diode;

means electrically connecting the N type second region to the drain N-type region of the NMOS transistor; and means electrically connecting the P+ type region to the gate of the NMOS transistor.

2. The circuit of claim 1 in which the gate has a pair of ends and the P+ type region is positioned adjacent one of the ends of the gate.

3. The circuit of claim 2 in which the gate is a strip of conductive polycrystalline silicon having an enlarged terminal pad at one end.

4. The circuit of claim 3 including an N+ type region contacting the N-type region to form a contact region for the N-type region.

5. The circuit of claim 4 in which the means electrically connecting the P+ type region to the gate comprises a strip of a conductive material over and insulated from the surface of the substrate, said conductive strip being electrically connected to the P+ type region and to the terminal pad of the gate.

6. The circuit of claim 5 in which the means electrically connecting the N+ type contact region to the drain N-type region of the NMOS transistor comprises a strip of a conductive material electrically connected to the N+ type contact region and the N-type first region forming the drain of the NMOS transistor.

\* \* \* \* \*